US010505094B2

(12) United States Patent
Sunter et al.

(10) Patent No.: US 10,505,094 B2
(45) Date of Patent: Dec. 10, 2019

(54) SUPERCONDUCTING NANOWIRE AVALANCHE PHOTODETECTORS WITH REDUCED CURRENT CROWDING

(71) Applicant: Massachusetts Institute of Technology, Cambridge, MA (US)

(72) Inventors: Kristen Ann Sunter, Somerville, MA (US); Faraz Najafi, Cambridge, MA (US); Adam Nykoruk McCaughan, Somerville, MA (US); Karl Kimon Berggren, Arlington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 891 days.

(21) Appl. No.: 14/983,139

(22) Filed: Dec. 29, 2015

(65) Prior Publication Data
US 2017/0186933 A1 Jun. 29, 2017

(51) Int. Cl.
| | | |
|---|---|---|
| *H01L 39/02* | (2006.01) | |
| *H01L 31/107* | (2006.01) | |
| *G01J 1/42* | (2006.01) | |
| *G01J 1/44* | (2006.01) | |

(52) U.S. Cl.
CPC ............... *H01L 39/02* (2013.01); *G01J 1/42* (2013.01); *H01L 31/107* (2013.01); *G01J 2001/442* (2013.01); *G01J 2001/4466* (2013.01)

(58) Field of Classification Search
CPC .. H01L 39/02; H01L 31/07; G01J 1/42; G01J 2001/442; G01J 2001/4466
See application file for complete search history.

(56) References Cited

U.S. PATENT DOCUMENTS

| | | | | |
|---|---|---|---|---|
| 8,293,624 | B2* | 10/2012 | Romano | ............... B82Y 10/00 438/478 |
| 9,240,539 | B2* | 1/2016 | Nam | ........................ G01J 1/42 |
| 2008/0251865 | A1* | 10/2008 | Pinkerton | ............ B81B 3/0021 257/414 |

OTHER PUBLICATIONS

Akhlaghi, M. K. et al., "Reduced Dark Counts in Optimized Geometries for Superconducting Nanowire Single photon Detectors", Optics Express, vol. 20, No. 21, (2012), pp. 23610-23616.

(Continued)

*Primary Examiner* — Georgia Y Epps
*Assistant Examiner* — Don J Williams
(74) *Attorney, Agent, or Firm* — Smith Baluch LLP (57) ABSTRACT

Superconducting nanowire avalanche photodetectors (SNAPs) have using meandering nanowires to detect incident photons. When a superconducting nanowire absorbs a photon, it switches from a superconducting state to a resistive state, producing a change in voltage that can be measured across the nanowire. A SNAP may include multiple nanowires in order to increase the fill factor of the SNAP's active area and the SNAP's detection efficiency. But using multiple meandering nanowires to achieve high fill-factor in SNAPs can lead to current crowding at bends in the nanowires. This current crowding degrades SNAP performance by decreasing the switching current, which the current at which the nanowire transitions from a superconducting state to a resistive state. Fortunately, staggering the bends in the nanowires reduces current crowding, increasing the nanowire switching current, which in turn increases the SNAP dynamic range.

20 Claims, 7 Drawing Sheets

(56) References Cited

OTHER PUBLICATIONS

Berggren, K. K., "Superconducting nanowire single-photon detectors", Research Gate, (Jan. 2006), Massachusetts Institute of Technology, 99 pages.

Clem, J. R. et al. "Geometry-dependent critical currents in superconducting nanocircuits," Physical Review B, vol. 84, (Sep. 22, 2011), pp. 174510-1 to 174510-27.

Ejrnaes et al. "A Cascade Switching Superconducting Single Photon Detector," Applied Physics Letters, vol. 91, (2007), pp. 262509-1 to 262509-3.

Hofherr, M., "Real-time imaging systems for superconducting nanowire single-photon detector arrays," KIT Scientific Publishing, (Mar. 11, 2014), 216 pages.

Hortensius et al. "Critical-current reduction in thin superconducting wires due to current crowding," Applied Physics Letters, vol. 100, (2012), pp. 182602-1 to 182602-4.

Marsili, F. et al., "Single-photon detectors based on ultra-narrow superconducting nanowires", Nano Letters, vol. 11, No. 5, (2011), pp. 2048-2053.

McCaughan, A. N., "Superconducting thin film nanoelectronics", Doctoral Dissertation presented to the School of Electrical Engineering and Computer Science, Massachusetts Institute of Technology, (Sep. 2015), 171 pages.

Najafi et al. "Timing performance of 30-nm-wide superconducting nanowire avalanche photodetectors," Applied Physics Letters, vol. 100, (2012), pp. 152602-1 to 152602-4.

Najafi, F., "Superconducting Nanowire Single-Photon Detectors: New Detector Architectures and Integration with Photonic Chips", Doctoral Dissertation presented to the School of Electrical Engineering and Computer Science, Massachusetts Institute of Technology, (Jun. 2015), 161 pages.

Sunter, K. A., "Optical Modeling of Superconducting Nanowire Single Photon Detectors", Doctoral Dissertation presented to the School of Engineering and Applied Science, Harvard University, (Sep. 2014), 203 pages.

Yang et al. "Suppressed Critical Current in Superconducting Nanowire Single-Photon Detectors With High Fill-Factors," IEEE Transactions on Applied Superconductivity, vol. 19, No. 3, (2009), pp. 318-322.

* cited by examiner

SUPERCONDUCTING NANOWIRE AVALANCHE PHOTODETECTORS WITH REDUCED CURRENT CROWDING

GOVERNMENT SUPPORT

This invention was made with Government support under Grant No. FA9550-14-1-0052 awarded by the Air Force Office of Scientific Research and under Contract No. FA8650-11-C-7105 awarded by the U.S. Air Force. The Government has certain rights in the invention.

BACKGROUND

A superconducting nanowire avalanche photodetectors (SNAP) comprises two or more nanowires connected in parallel between an input contact and an output contact. In operation, the nanowires are cooled below their critical temperature so that they become superconducting. While cooled, a current runs through the nanowires between the input contact and the output contact. Because the nanowires are in parallel, the current is split equally among the nanowires. Illuminating one of the nanowires with a photon creates a hotspot with increased resistance, diverting current into the other nanowire(s). This causes the current in the other nanowire(s) to exceed the critical current, which is the current at which the nanowires transition from superconducting to resistive, and creates a voltage difference that can be detected across the entire device.

One advantage of a SNAP is the increase in the single-to-noise ratio (SNR) of the output of the detector by a factor of approximately the number of nanowires in parallel, N. A higher SNR allows thinner nanowires that are more sensitive to infrared (IR) photons to be used. However, the maximum SNR achieved to date remains below the theoretical value, even in SNAPs with meandering nanowires have been developed. This problem has also been observed in high fill-factor superconducting nanowire single photon detectors (SNSPDs) based on a single meandering nanowire.

The less-than-ideal SNR may be due to current crowding at sharp corners or non-optimal curves in the SNAP's meandering nanowires. Current crowding can lead to increased current density in the corner region compared to the current density in the rest of the device. Areas of current crowding switch to the normal state at device bias currents less than the switching current of the nanowires composing the rest of the device and thus limit the bias current at which the device can be operated.

SUMMARY

Embodiments of the present technology include SNAPs with lower current crowding and higher achievable signal-to-noise ratios (SNRs) than conventional SNAPs. An example SNAP comprises a substrate; a first nanowire disposed on the substrate and having a first straight section extending along a first direction and a first bent section electrically coupled to the first straight section; and a second nanowire disposed on the substrate and having a second straight section parallel to the first straight section and a second bent section electrically coupled to the second straight section and staggered in the first direction with respect to the first bent section.

In some cases, the first straight section has a width of about 10 nm to about 300 nm. The first straight section and the second straight section are arrayed on a pitch of about 50 nm to about 500 nm. The first bent section may comprise a boundary defining at least a portion of one of a circle, a parabola, or a hyperbola.

The second bent section may be staggered with respect to the first bent section by an offset selected to set a peak current density in the second bent section to within about 20% of an average current density in the second straight section. The second bent section may also be staggered with respect to the first bent section by an offset selected to set a peak current density in the second bent section to within about 10% of an average current density in the second straight section. The second bent section may also be staggered with respect to the first bent section by an offset selected to set a peak current density in the second bent section to less than or equal to about 110% of a peak current in the first straight section.

The superconducting nanowire photodetector may have an avalanche current of about 10 µA. In operation, the superconducting nanowire photodetector may be configured to be biased at about 10 µA to about 100 µA above the avalanche current.

A superconducting nanowire photodetector may also include a third nanowire disposed on the substrate and having a third straight section parallel to the first straight section. The third nanowire also has a third bent section that is electrically coupled to the third straight section and staggered in the first direction with respect to the first bent section and/or the second bent section.

In operation, the superconducting nanowire detector can be cooled to below a critical temperature so as to cause the first nanowire and the second nanowire to become superconducting. A bias current is then applied to the first nanowire and the second nanowire. And a change in resistance (e.g., of about 100 kΩ to about 10 MΩ) of the first nanowire is measured when the first nanowire generates a photoelectron in response to absorption of a photon.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

DETAILED DESCRIPTION

Current crowding occurs in nanowires (e.g., at bends and junctions) when the current density increases in magnitude. For example, the current density—which may be uniform in a straight section of the nanowire—may increase in magnitude near a bend or intersection in the nanowire. The increased current density acts as a weak point for the breakdown of superconductivity, either through the entry of vortices or the formation of a hotspot. Current crowding decreases the overall SNAP switching current (i.e., the current at which the SNAP witches from a superconducting state to a resistive state). For a SNAP, this decrease in switching current can reduce the SNAP's dynamic range and/or achievable signal-to-noise ratio (SNR).

Current crowding can also degrade a SNAP's sensitivity, e.g., by constraining the ability to bias the SNAP at higher switching currents. Operation at higher current is often desirable for applications where fine timing resolution is desired—the higher the bias current, the more sensitive the SNAP is to incident photons. Some examples of the SNAPs disclosed herein can operate at about 10 μA to about 100 μA above the avalanche current, which may be about 10 μA (corresponding to an avalanche current density on the order of 50 nA/m$^2$). If the bias current of an N-SNAP (a SNAP with N sections) is higher than the avalanche current, when one section switches to the normal conducting state after absorbing a photon, it diverts current to the other N-1 sections of the N-SNAP, driving them normal in a process called an "avalanche." The avalanche yields a current that is about N times higher than the current diverted by the section that absorbed the photon.

The SNAPs disclosed herein have reduced current crowding and higher fill factors than other SNAPs. The reduced current crowding enables SNAP operation at larger switching currents and increases the device detection efficiency (the probability of getting a signal once a photon is absorbed). In some examples, these SNAPs include N-SNAPs whose nanowires have staggered curves to reduce or eliminate current crowding in the region(s) between the middle nanowire(s) and the outer nanowire(s) in each turn. In some cases, staggering the curves reduces the current density in the turn by approximately 40%. Experimentally, this results in a 50% increase in the detection efficiency and an increase of approximately 5% in the critical current over conventional N-SNAPs.

Staggered N-SNAPs

Figure 1:
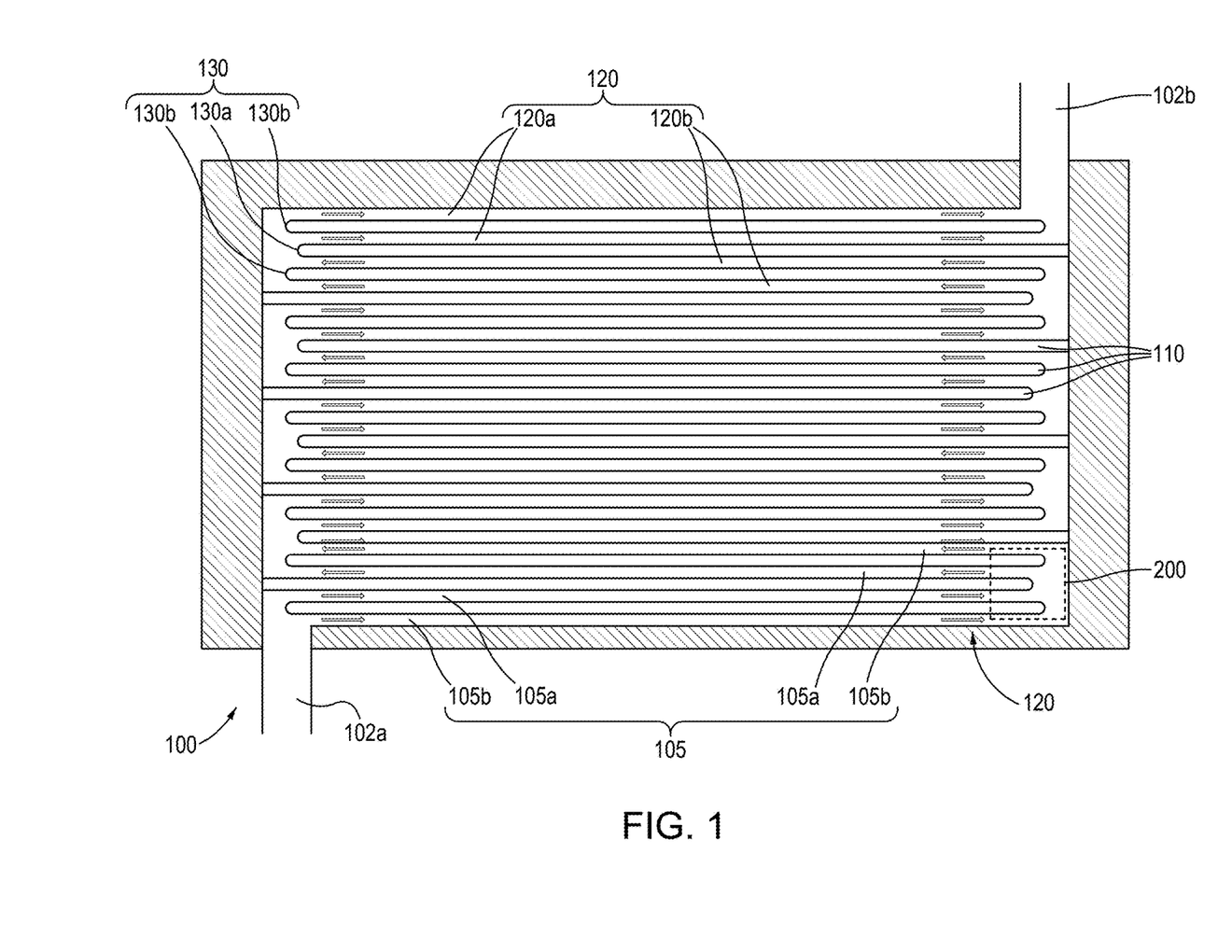
FIG. 1 is a schematic diagram of a superconducting nanowire avalanche photodetector (SNAP) comprising two meandering nanowires with staggered bent sections.

FIG. 1 shows a schematic diagram of a superconducting nanowire avalanche photodetector (SNAP) 100. The SNAP 100 can include any number of nanowires in a numbered-SNAP system, including a 2-nanowire system (namely 2-SNAP system), 3-nanowire system (namely 3-SNAP system), 4-nanowire system (namely 4-SNAP system), and so on and so forth. The embodiment described in FIG. 1 comprises two meandering nanowires 105a and 105b (collectively, nanowire 105) disposed on a substrate 110, and is an example of a 2-SNAP system. The nanowires 105 meander back and forth with 180-degree bends to fill a rectangular photodetecting area 120, and are electrically connected to an input source terminal 102a and an output source terminal 102b (collectively, terminals 102) to form the SNAP 100. The nanowires 105 include respective straight sections 120a and 120b (collectively, straight section 120) and respective bent sections 130a and 130b (collectively, bent sections 130) that are electrically connected to the respective straight sections. In some embodiments, the bent sections 130 are designed to achieve different turning radius for the nanowires 105 to optimize the photodetection. An embodiment of the bent sections 130, indicated in FIG. 1 as a staggered bent section area 200, is further described below and shown in greater detail in FIG. 2.

In operation, the SNAP 100 detects photons across incident on the 2 meandering nanowires 105 with a high signal-to-noise ratio (SNR). When the SNAP 100 is cooled to superconducting temperature and an electrical connection is established across the terminals 102 to an external bias voltage 112, the nanowires 105 conduct electrical current with little to no resistance. The superconducting state of the nanowires 105 switches to a normal resistant (non-superconducting) state when photon detection occurs, which gives rise to a change in voltage across and/or resistance (e.g., of about 100 kΩ to about 10 MΩ) of the conducting nanowires as described above. This change in voltage and/or resistance can be measured across the terminals 102 to give an indication of the incident photon.

Sometimes, the change in electrical resistance across the superconducting nanowires can occur without any photons striking the nanowires. This can happen when the nanowires are operating at a higher current density to achieve a high signal-to-noise ratio in photon detection using less than desirable and/or imperfect nanowires. Non-photodetecting switch from the superconducting to resistant state can be caused by material defects in the nanowires and/or current crowding at the non-straight section of the nanowires, particularly when a high current is turned along the bent sections 130.

Figure 2:
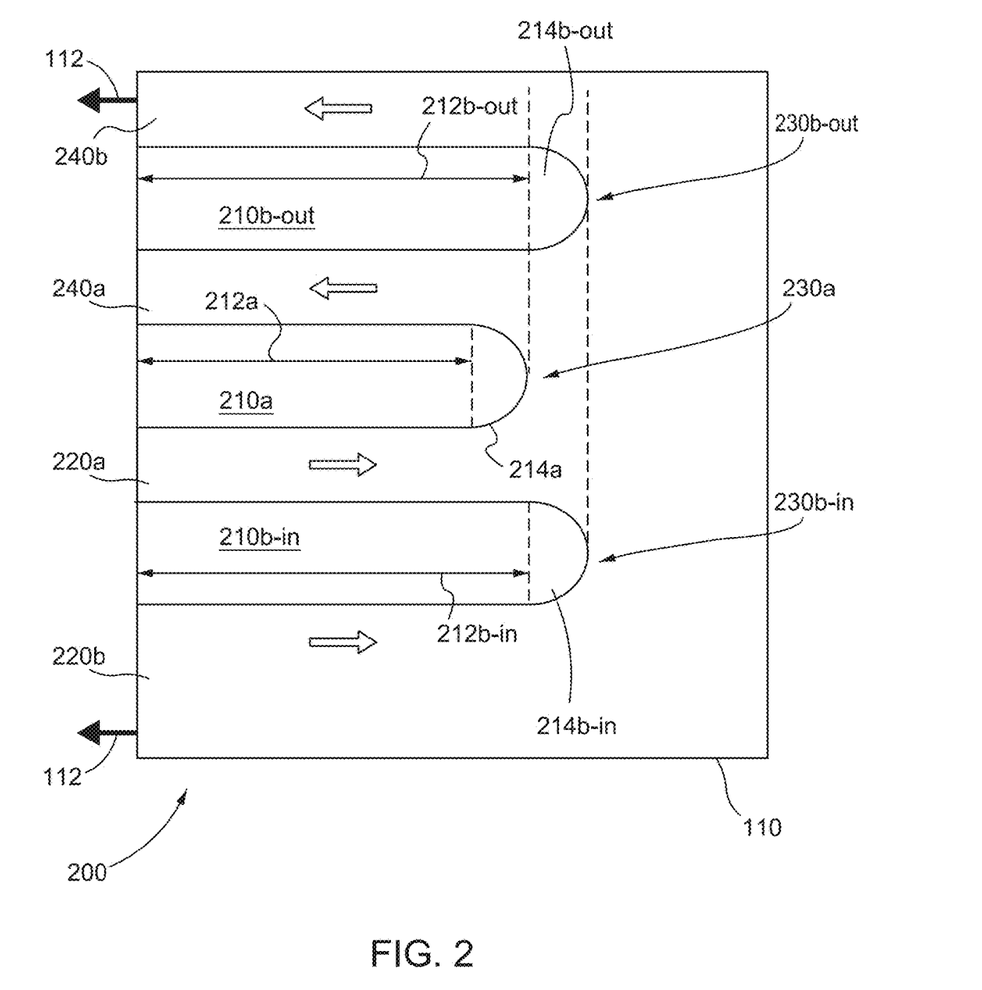
FIG. 2 is a close up of a staggered bent section area in the SNAP of FIG. 1.

FIG. 2 shows a schematic diagram of the staggered bent section area 200 of the SNAP 100 shown in FIG. 1. The staggered bent section 200 comprises two meandering sections 205a and 205b (collectively, nanowire sections 205) of the nanowires 105 disposed on the substrate as shown in FIG. 1 and described above. The nanowire sections 205a and 205b comprise respective inbound straight sections 220a and 220b (collectively, inbound straight sections 220), respective bent sections 230a and 230b (collectively, bent sections 230), and respective outbound straight sections 240a and 240b (collectively, outbound straight sections 240). As illustrated in FIG. 2, the inbound straight sections 220 conduct current rightward (inward into the bent sections 230) and the outbound straight sections 240 conduct current leftward (outward from the bent section 230). The bent section 230a electrically connects the straight sections 220a and 240a of the inner nanowire 205a, whereas the bent section 230b, which further includes bent sections 230b-in and 230b-out (collectively, bent section 230b) electrically connects the straight sections 220b and 240b of the outer nanowire 205b. Those of skill in the art will readily appreciate that the current flow directions and orientation of the SNAP 100 shown in FIG. 2 are merely illustrative and that other current flow directions and SNAP orientations are also possible.

FIG. 2 also shows some areas of the substrate 110 that are not covered by the nanowire sections 205. These areas are referred to as insulating regions 210a and 210b (collectively, insulating regions 210). The insulating region 210a corresponds to the region enclosed by the straight section 220a, the bent section 230a, and the straight section 240a of the meandering nanowire 205a. The insulating region 210b further comprises insulating regions 210b-in and 210b-out (collectively, insulating regions 210b), where the insulating region 210b-in refers to the region bounded by the straight section 220b, the bent section 230b-in, and the straight section 220a, and the insulating region 210b-out refers to the region bounded by the straight section 240a, the bent section 230b-out, and the straight section 240b.

Each of the insulating regions 210a, 210b-in, and 210b-out shown in FIG. 2 comprises two segments, namely, respective insulating straight segments 212a, 212b-in, and 212b-out (collectively insulating straight segments 212) and respective insulating tip segments 214a, 214b-in, and 214b-out (collectively insulating tip segments 214). The insulating straight segments 212b-in and 212b-out (collectively insulating straight segments 212b) may have the same dimensions. The insulating tip segments 214b-in and 214b-out (collectively insulating tip segments 214b) may have the same shape and form factor. All the insulating tip segments 214 can have any shape or form, including but not limited to parabola, hyperbola, circular, semi-circular, and any angled polygons. Each insulating tip segment 214 can also have a different shape. For instance, insulating tip segment 214a may be semi-circular, whereas insulating tip segments 214b-in and 214b-out may be in the shape of 90-degree arcs.

The insulating straight segments 212 of the insulating regions 210 are parallel along a first direction. Said another way, the insulating regions 210 are parallel to each other, but are separated from each other by the width of the nanowires 205 along the second direction. The nanowire pitch may range from about 50 nm to about 500 nm (e.g., 50 nm, 100 nm, 150 nm, 200 nm, 250 nm, 300 nm, 450 nm, or 500 nm).

Each of the insulating tip segments 214, which are the extension tips of the insulating regions 210, are staggered with respect to each other in the first direction; that is, they are aligned with respect to different lines perpendicular to the first direction. The insulating tip segments 214 are also offset with respect to each other in a second direction perpendicular to the first direction. The illustration in FIG. 2 clearly shows the stagger and offset of the insulating tip region 214a with respect to the insulating tip regions 214b-in and 214b-out in the first and second directions, respectively.

In other terms, the insulating tip segments 214 can be defined in part by axes that are perpendicular to the substrate 210 and parallel to each other. Each axis may contain the center or focus of the curve that defines the boundary of the respective insulating tip segment 214 (e.g., the center of a circular arc or focus of a parabolic, hyperbolic, or elliptical arc). Because the insulating tip segments 214 are staggered with respect to each other, the axes do not lie in the same plane. (The tip segments shown in FIGS. 3 and 4 and described in greater detail below can also be defined by axes that are perpendicular to the substrate 210 and parallel to, but not coplanar with, each other.)

In operation, the staggered bent section 200 conducts current from the inbound straight sections 220 to the outbound straight sections 240 via the bent sections 230. As described below with respect to FIGS. 5 and 6, simulations show that staggering the bent sections 230 as shown in FIG. 2 alleviates current crowding. In some cases, staggering may reduce or eliminate areas with zero current density to increase fill factor without increasing current crowding.

Figure 3:
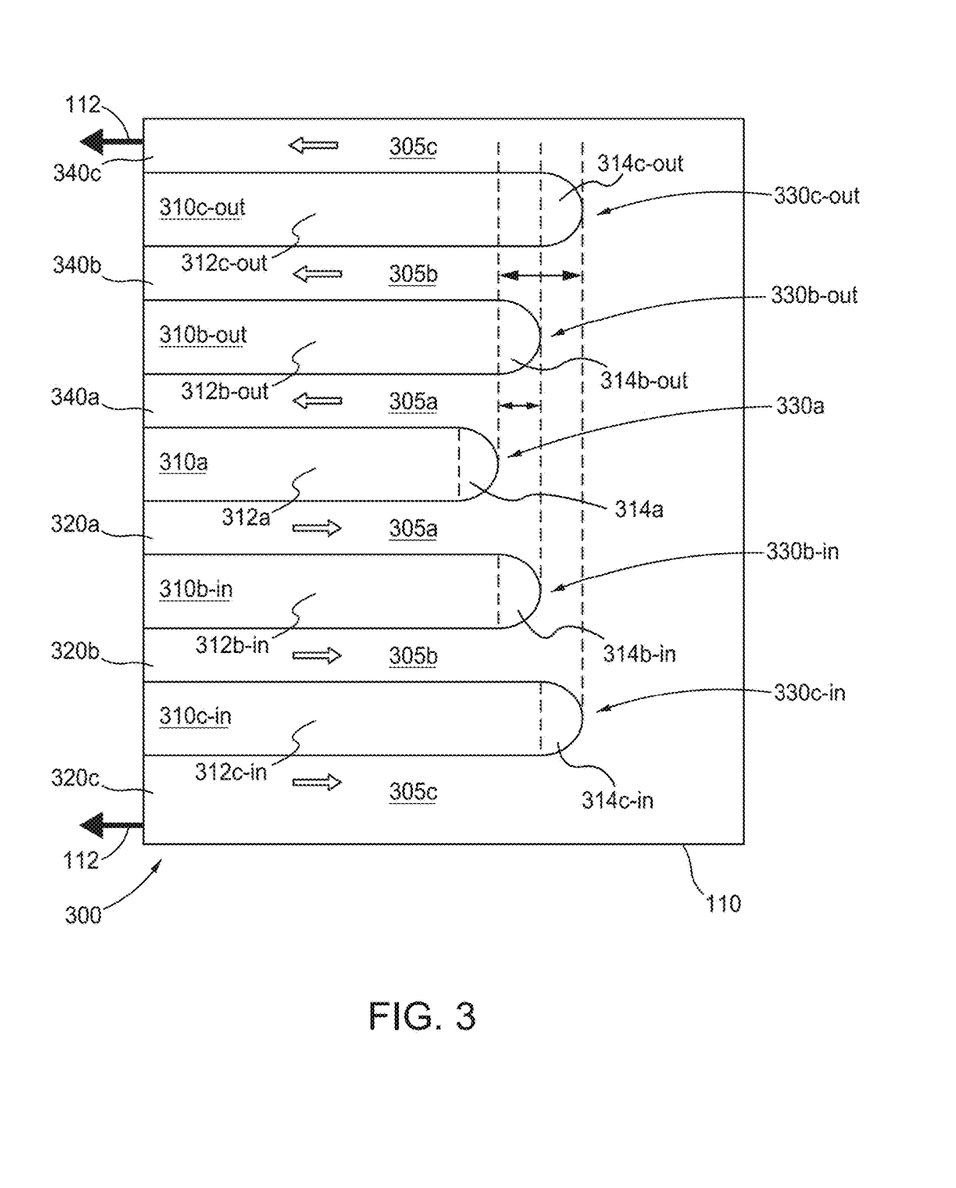
FIG. 3 is a schematic diagram of a 3-SNAP staggered bent section area showing various sections of the nanowires and staggered bent sections.

FIG. 3 shows a staggered bent section area 300 of a 3-SNAP system. The staggered bent section 300 comprises 3 meandering nanowires 305a, 305b, and 305c (collectively, nanowires 305) disposed on a substrate 310. The nanowires 305a, 305b, and 305c comprise respective inbound straight sections 320a, 320b, and 320c (collectively, inbound straight section 320), respective bent sections 330a, 330b, and 330c (collectively, bent section 330) and another set of respective outbound straight sections 340a, 340b, and 340c (collectively, outbound straight section 340). As shown in FIG. 3, the inbound straight section 320 conducts current rightward (inward into the bent section 330) and the outbound straight section 340 conducts current leftward (outward from the bent section 330). The bent section 330a electrically connects the inbound straight sections 320a and outbound straight sections 340a of the inner nanowire 305a, whereas the bent section 330b, which further includes bent sections 330b-in and 330b-out (collectively, bent section 330b) electrically connects the inbound straight sections 320b and outbound straight sections 340b of the middle nanowire 305b, and the bent section 330c, which further includes bent sections 330c-in and 330c-out (collectively, bent section 330c) electrically connects the inbound straight sections 320c and outbound straight sections 340c of the outer nanowire 305c.

FIG. 3 also shows some areas of the substrate 310 whose surface not physically covered by the nanowire 305. These areas are referred to as insulating regions 310a, 310b, and 310c (collectively insulating regions 310). The insulating region 310a corresponds to the region enclosed by the inbound straight section 320a, the bent section 330a, and the outbound straight section 340a of the meandering nanowire 305a. The insulating region 310b further comprises insulating regions310b-in and 310b-out (collectively, insulating regions 310b), where the insulating region 310b-in refers to the region bounded by the incoming straight section 320b, the bent section 330b-in, and the incoming straight section 320a, and the insulating region 310b-out refers to the region bounded by the outbound straight section 340a, the bent section 330b-out, and the outbound straight section 340b. Likewise, the insulating region 310c further comprises insulating regions 310c-in and 310c-out (collectively, insulating regions 310c), where the insulating region 310c-in refers to the region bounded by the inbound straight section 320c, the bent section 330c-in, and the inbound straight section 320b, and the insulating region 310c-out refers to the region bounded by the outbound straight section 340b, the bent section 330c-out, and the outbound straight section 340c.

Each of the insulating regions 310a, 310b-in, 310b-out, 310c-in, and 310c-out shown in FIG. 3 comprises two segments, namely, respective insulating straight segments 312a, 312b-in, 312b-out, 312c-in, and 312c-out (collectively insulating straight segments 312) and respective insulating tip segments 314a, 314b-in, 314b-out, 314c-in, and 314c-out (collectively insulating tip segments 314). The insulating straight segments 312b-in and 312b-out (collectively, insulating straight segments 312b) may have the same dimensions, and the insulating straight segments 312c-in and 312c-out (collectively, insulating straight segments 312c) may have the same dimensions. The insulating tip segments 314b-in and 314b-out (collectively, insulating tip segments 314b) may have the same shape and form factor, and the insulating tip segments 314c-in and 314c-out (collectively, insulating tip segments 314c) may have the same shape and form factor. Each insulating tip segment 314 can have any suitable shape or form, including but not limited to parabola, hyperbola, circular, semi-circular, and any angled polygons.

In operation, the staggered bent section 300 detects photons across incident on the 3 meandering nanowires 305, including the inbound straight sections 320 and outbound straight sections 340, and the bent sections 330 with a high signal-to-noise ratio (SNR). When the staggered bent section 300 is cooled to superconducting temperature and an external bias voltage 112 is applied, the nanowires 305 conduct electrical current with little to no resistance. The superconducting state of the nanowires 305 switches to a normal resistant (non-superconducting) state when photon detection occurs, which gives rise to a non-zero resistance in the conducting nanowires. This change in resistance can be measured to give an indication of the incident photon.

Figure 4:
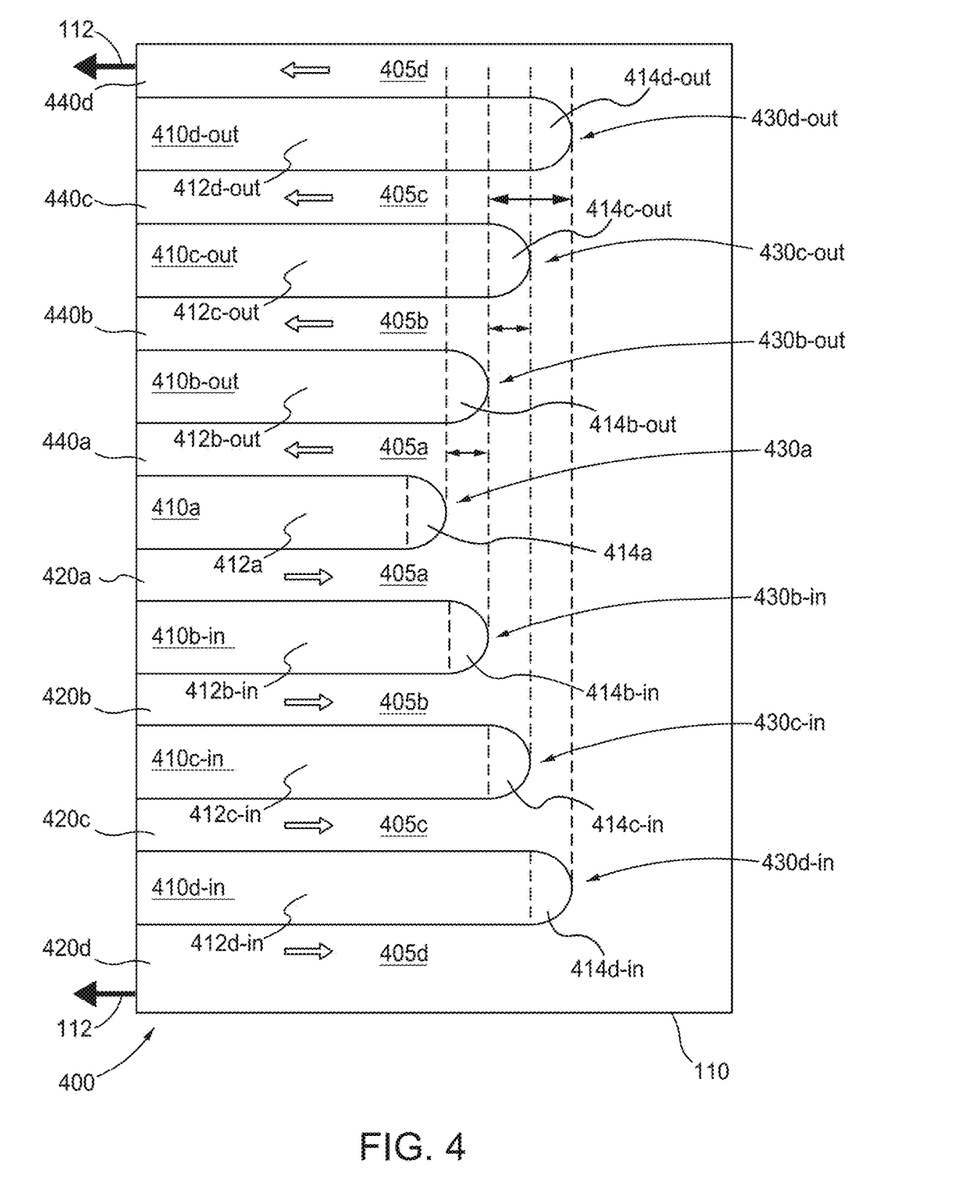
FIG. 4 is a schematic diagram of a 4-SNAP staggered bent section area showing various sections of the nanowires and staggered bent sections.

FIG. 4 shows a schematic diagram of another exemplary staggered bent section area 400 of a 4-SNAP system. The staggered bent section 400 comprises 4 meandering nanowires 405a, 405b, 405c, and 405d (collectively, nanowires 405) disposed on the substrate 410. The nanowires 405a, 405b, 405c, and 405d comprise respective inbound straight sections 420a, 420b, 420c, and 420d (collectively, inbound straight section 420), respective bent sections 430a, 430b, 430c, and 430d (collectively, bent section 430) and another set of respective outbound straight sections 440a, 440b, 440c, and 440d (collectively, outbound straight section 440). As shown in FIG. 4, the inbound straight section 420 conducts current rightward (inward into the bent section 430) and the outbound straight section 440 conducts current leftward (outward from the bent section 430). The bent section 430a electrically connects the inbound straight sections 420a and outbound straight sections 440a of the inner nanowire 405a, whereas the bent section 430b, which further includes bent sections 430b-in and 430b-out (collectively, bent sections 430b) electrically connects the inbound straight sections 420b and outbound straight sections 440b of the inner-middle nanowire 405b, the bent section 430c, which further includes bent sections 430c-in and 430c-out (collectively, bent sections 430c) electrically connects the inbound straight sections 420c and outbound straight sections 440c of the outer-middle nanowire 405c, and the bent sections 430d, which further includes bent sections 430d-in and 430d-out (collectively, bent sections 430d) electrically connects the inbound straight sections 420d and outbound straight sections 440d of the outer nanowire 405d.

FIG. 4 also shows some areas of the substrate 410 whose surface not physically covered by the nanowires 405. These areas are referred to as insulating regions 410a, 410b, 410c, and 410d (collectively, insulating regions 410). The insulating region 410a corresponds to the region enclosed by the inbound straight section 420a, the bent section 430a, and the outbound straight section 440a of the meandering nanowire 405a. The insulating region 410b further comprises insulating regions 410b-in and 410b-out (collectively, insulating region 410b), where the insulating region 410b-in refers to the region bounded by the inbound straight section 420b, the bent section 430b-in, and the inbound straight section 420a, and the insulating region 410b-out refers to the region bounded by the outbound straight section 440a, the bent section 430b-out, and the outbound straight section 440b. Likewise, the insulating region 410c further comprises insulating regions 410c-in and 410c-out (collectively, insulating regions 410c), where the insulating region 410c-in refers to the region bounded by the inbound straight section 420c, the bent section 430c-in, and the inbound straight section 420b, and the insulating region 410c-out refers to the region bounded by the outbound straight section 440b, the bent section 430c-out, and the outbound straight section 440c. Furthermore, the insulating regions 410d further comprises insulating regions 410d-in and 410d-out (collectively, insulating regions 410d), where the insulating region 410d-in refers to the region bounded by the inbound straight section 420d, the bent section 430d-in, and the inbound straight section 420c, and the insulating region 410d-out refers to the region bounded by the outbound straight section 440c, the bent section 430d-out, and the outbound straight section 440d.

Each of the insulating regions 410a, 410b-in, 410b-out, 410c-in, 410c-out, 410d-in, and 410d-out shown in FIG. 4 comprises two segments, namely, respective insulating straight segments 412a, 412b-in, 412b-out, 412c-in, 412c-out, 412d-in, and 412d-out (collectively, insulating straight segments 412) and respective insulating tip segments 414a, 414b-in, 414b-out, 414c-in, 414c-out, 414d-in, and 414d-out (collectively, insulating tip segments 414). The insulating straight segments 412b-in and 412b-out (collectively, insulating straight segments 412b) may have the same dimensions, the insulating straight segments 412c-in and 412c-out (collectively, insulating straight segments 412c) may have the same dimensions, and the insulating straight segments 412d-in and 412d-out (collectively, insulating straight segments 412d) may have the same dimensions. The insulating tip segments 414b-in and 414b-out (collectively, insulating tip segments 414b) may have the same shape and form factor, the insulating tip segments 414c-in and 414c-out (collectively, insulating tip segments 414c) may have the same shape and form factor, and the insulating tip segments 414d-in and 414d-out (collectively, insulating tip segments 414d) may have the same shape and form factor. All the insulating tip segments 414 can have any shape or form, including but not limited to parabola, hyperbola, circular, semi-circular, and any angled polygons.

The parameters of the bent sections shown in FIGS. 1-4, including the amount of stagger between adjacent nanowires, tip shape, nanowire width, nanowire pitch, and number of nanowires can be selected based on a desired degree of current crowding. For instance, these parameters may be selected such that the ratio of peak current density at the tip to the average current density within the straight sections of the nanowires is within a particular range, e.g., about 1.0 to about 1.2. For instance, the peak current density in the corner to the current density may be about 0-10% greater than the peak current density in the straight section of the nanowire. This translates roughly to a 10% suppression of the switching current. Selecting the bent section parameters to limit the peak current density with respect to the average current density reduces the likelihood that current crowding will cause the SNAP to stop superconducting in the absence of an incident photon.

In operation, the staggered bent section 400 detects photons across incident on the 4 meandering nanowires 405, including the inbound straight sections 420 and outbound straight sections 440, and the bent sections 430 with a high signal-to-noise ratio (SNR). When the staggered bent section 400 is cooled to superconducting temperature and an external bias voltage 112 is applied, the nanowires 405 conduct electrical current with little to no resistance. The superconducting state of the nanowires 405 switches to a normal resistant (non-superconducting) state when photon detection occurs, which gives rise to a non-zero resistance in the conducting nanowires. This change in resistance can be measured to give an indication of the incident photon.

Simulated Current Density Maps of Staggered and Unstaggered 3-SNAPs

Figure 5:
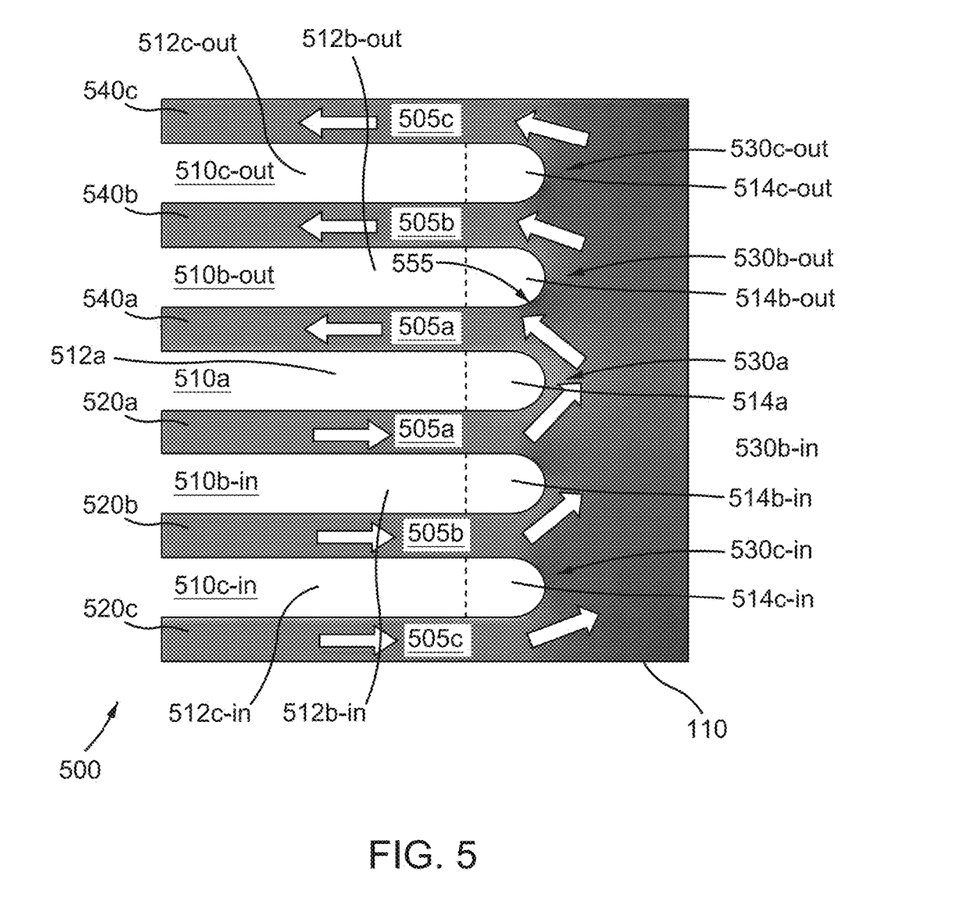
FIG. 5 is a current density map of part of a conventional 3-SNAP showing areas of zero current density and areas with current crowding.

FIG. 5 shows a current density map of an exemplary non-staggered bent section area 500 of a conventional (unstaggered) 3-SNAP system. The bent section 500 comprises three meandering nanowires 505a, 505b, and 505c (collectively, nanowires 505) disposed on the substrate 510. The nanowires 505a, 505b, and 505c comprise respective inbound straight sections 520a, 520b, and 520c (collectively, inbound straight sections 520), respective bent sections 530a, 530b, and 530c (collectively, bent sections 530) and respective outbound straight sections 540a, 540b, and 540c (collectively, outbound straight sections 540). As shown in FIG. 5, the inbound straight sections 520 conduct current rightward (inward into the bent section 530) and the outbound straight sections 540 conduct current leftward (outward from the bent section 530). The bent section 530a electrically connects the straight sections 520a and 540a of the inner nanowire 505a, whereas the bent section 530b, which further includes bent sections 530b-in and 530b-out (collectively, bent section 530b) electrically connects the straight sections 520b and 540b of the middle nanowire 505b. The bent section 530c, which further includes bent sections 530c-in and 530c-out (collectively, bent section 530c) electrically connects the straight sections 520c and 540c of the outer nanowire 505c.

FIG. 5 also shows some areas of the substrate 510 that are not covered by conductive material. These areas are referred to as insulating regions 510a, 510b, and 510c (collectively, insulating regions 510). The insulating region 510a corresponds to the region enclosed by the inbound straight section 520a, the bent section 530a, and the outbound straight section 540a of meandering nanowire 505a. The insulating region 510b further comprises insulating regions 510b-in and 510b-out (collectively, insulating regions 510b), where the insulating region 510b-in is the region bounded by the inbound straight section 520b, the bent section 530b-in, and the outbound straight section 520a, and the insulating region 510b-out is the region bounded by the inbound straight section 540a, the bent section 530b-out, and the outbound straight section 540b. Likewise, the insulating region 510c further comprises insulating regions 510c-in and 510c-out (collectively, insulating regions 510c), where the insulating region 510c-in is bounded by the inbound straight section 520c, the bent section 530c-in, and the outbound straight section 520b, and the insulating region 510c-out is bound by the inbound straight section 540b, the bent section 530c-out, and the outbound straight section 540c.

Each of the insulating regions 510 shown in FIG. 5 comprises two sections, namely, respective straight sections 512a, 512b-in, 512b-out, 512c-in, and 512c-out (collectively insulator straight sections 512) and respective tip sections 514a, 514b-in, 514b-out, 514c-in, and 514c-out (collectively insulator tip section 514). All the straight sections 512 have the same dimensions, and all of the tip sections 514 are aligned to a tangent line perpendicular to the.

Superimposed on the schematic diagram of FIG. 5 is the current density map of the non-staggered bent section area 500 according to finite element analysis. The dark areas signify regions of the nanowires 505 with lower current density, and light areas represent regions of the nanowires 505 with higher current density. For each nanowire 505, the inbound straight sections 520 and outbound straight sections 540 have uniform current densities, whereas the bent sections 530 have varying current densities across all three bent sections. In particular, in the inner bent sections, for example, around bent sections 530a and 530b, the dark area 555 indicates an area where the current density is zero or close to zero, and the lighter bright areas around the bent section 530a indicate regions of the nanowire 505 with high current density. The light areas with high current density often lead to current crowding due to the non-optimal turning of the current around the bent sections 530a, 530b-in, 530b-out, 530c-in, and 530c-out.

Note that regions around the bent sections 530 have different current density distributions. The inner most bent section 530a possesses high current density along the bent section, indicated by lighter shades on both on the inward and outward current flows. Compared to the bent section 530a, the current flows around the middle and outer bent sections 530b and 530c show both high current density and low current density areas, depending on the orientation of the nanowire 505 in respect to the current flow. Around the bent section 530b-in, the inward current flow takes place on both sides of the bent section, but the underside of the bent section 530b-in shows current crowding whereas the upperside of the bent section 530b-in shows zero or close to zero current density.

In contrast, the underside of the bent section 530b-out shows zero or close to current density whereas the upperside of the bent section 530b-out indicates current crowding, for the bent section 530b-out facing outward current flows on both sides. Likewise, around the bent section 530c-in, the inward current flow takes place on both sides of the bent section, but the underside of the bent section 530c-in shows current crowding whereas the upperside of the bent section 530c-in shows zero or close to zero current density. In contrast, the underside of the bent section 530c-out shows zero or close to current density whereas the upperside of the bent section 530c-out indicates current crowding, for the bent section 530c-out facing outward current flows on both sides. In short, the current density map of FIG. 5 shows mirror-symmetry between the bottom half (the current inflow) and the top half (the current outflow) about the (imaginary horizontal axis) middle of the insulator 510a/bent section 530a.

Figure 6:
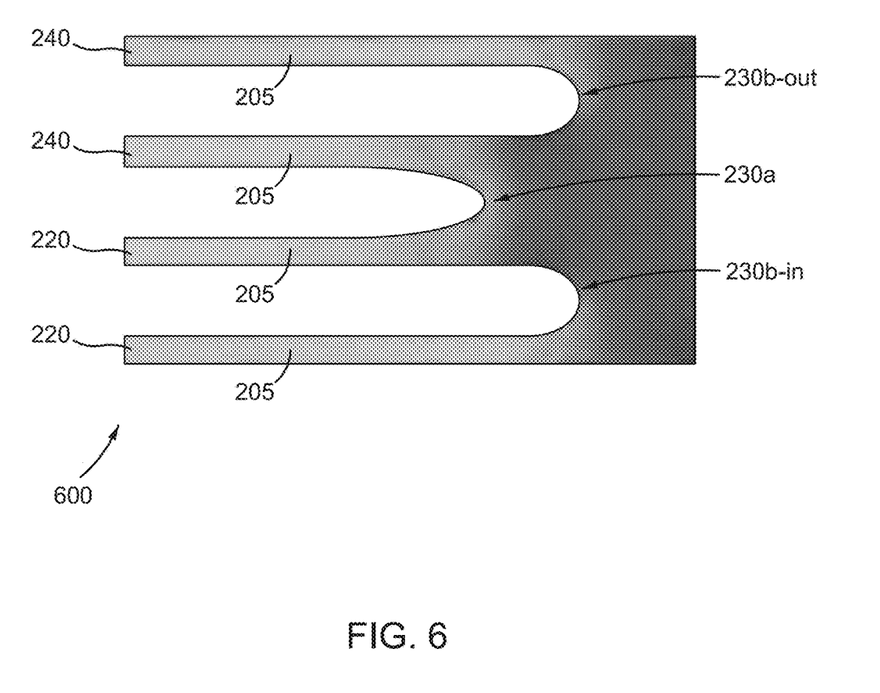
FIG. 6 is a current density map of the staggered bent section area shown in FIG. 2.

FIG. 6 shows a finite element simulation for the staggered bent section nanowire configuration 200 illustrated in FIG. 2. Superimposed on the schematic diagram of FIG. 6 is the current density map of the staggered bent section area 200 according to the finite element analysis. The contrast between dark and light areas of the nanowires shown in the current density map of FIG. 6 is not as pronounced as in FIG. 5, owing to the staggering of adjacent bent sections. This shows that staggering the bent sections alleviates current crowding and reduces or eliminates areas with zero current density to increase fill factor without increasing current crowding.

For each of the nanowires 205, the inbound straight sections 220 and outbound straight sections 240 have relatively uniform current densities, similar to the inbound straight sections 520 and outbound straight sections 540 presented in FIG. 5. However, unlike the bent section 530 shown in FIG. 5, the bent sections 230 also have fairly uniform current densities. The central bent section 230a is a near-uniform gray, indicating that there is little to no current crowding. Moreover, there is no apparent contrast between on opposite sides of the outer bent sections 230b-in and 230b-out, which indicates that the areas with zero current density are reduced or eliminated and that areas with current crowding have also been significantly reduced.

Fabricating a Staggered N-SNAP

Figures 7A, 7B:
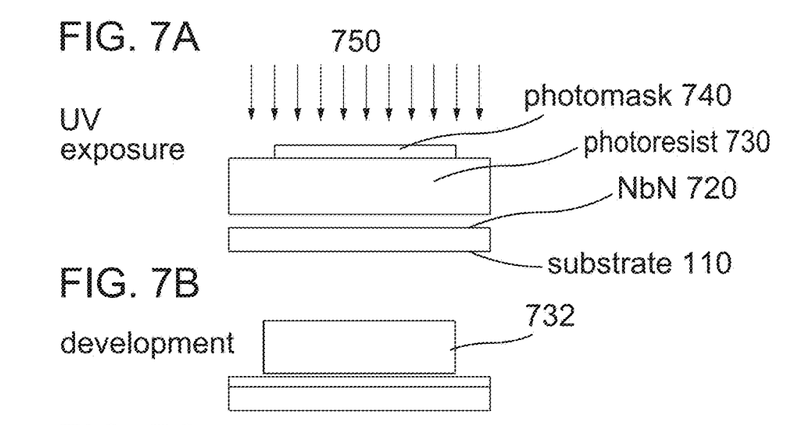
FIGS. 7A-7H show exemplary process for manufacturing a SNAP like those shown in FIGS. 1-4.
Figure 7C:
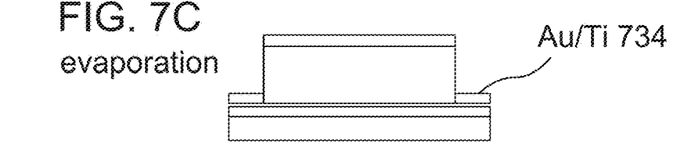
Figure 7D:
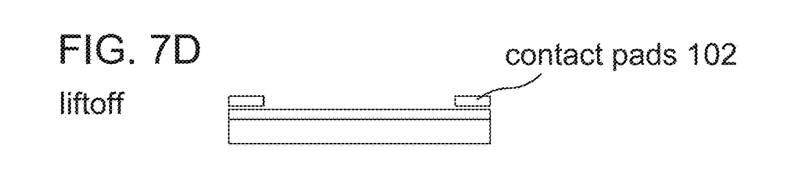

An exemplary staggered N-SNAPs can be fabricated using the manufacturing process. In this exemplary embodiment, any material with superconducting capabilities can be disposed onto the substrate 110 to form a SNAP. Some of the exemplary materials include niobium nitride (NbN), and many other materials that can superconduct at above absolute zero Kelvin (negative 275 degrees Celsius). As illustrated in FIG. 7A, after a layer of NbN 720 is disposed on the substrate 110, a layer of photoresist material 730 is deposited. Using a photomask 740, an ultraviolet radiation 750 is used to expose the photoresist 720. The exposed photoresist 720 is then developed to form a defined region 732 of developed photoresist material as shown in FIG. 7B. To create electrical contacts, a thin layer of gold and a titanium adhesion layer (collectively, conductive layer 734) are deposited as shown in FIG. 7C. FIG. 7 D shows that dissolving the photoresist layer 732 using a suitable liftoff technique leaves the NbN 720 coated substrate 110 with contact terminals 102 for connecting to external bias voltage sources.

Figure 7E:
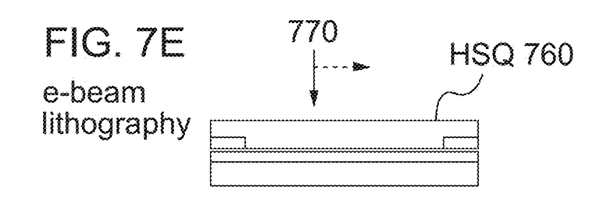
Figure 7F:
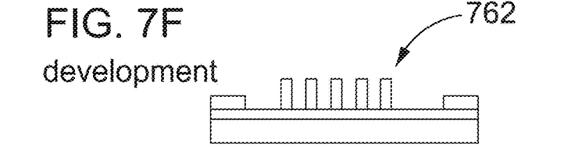
Figure 7G:
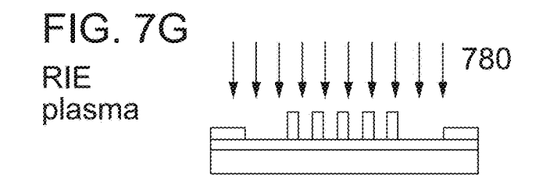
Figure 7H:
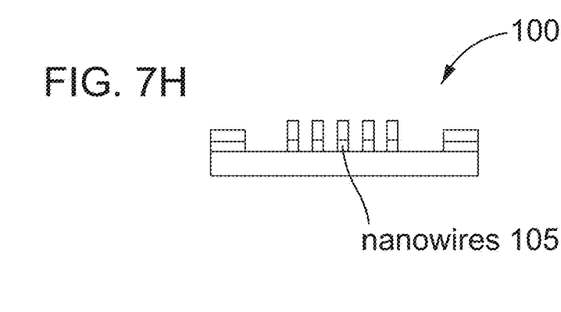

To create nanowires photodetectors SNAP systems 100, the NbN layer 720 is patterned to form thin and narrow nanowires 105. In order to do this, a layer of electron beam resist material, such as hydrogen silsesquioxane (HSQ) 760, is deposited on the plain NbN layer 720 with prepared contact terminals 102. Electron beam lithography 770 is employed to form the desired pattern of the SNAP system 100 by exposing certain parts of the HSQ 760, as illustrated in FIG. 7E. The development of the exposed areas creates patterns 762 in the HSQ layer 760 is carried out as shown in FIG. 7F. The resulting patterns are then used as an etch-mask to perform reactive-ion-etching (ME) to create patterns in the NbN layer 720, as shown in FIG. 7G. This pattern transfer results in creation of a SNAP 100 with nanowires 105 possessing the desired dimensions, as FIG. 7H illustrates.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments can be implemented in any of numerous ways. For example, embodiments of designing and making the SNAPs disclosed herein may be implemented using hardware, software or a combination thereof. When implemented in software, the software code can be executed on any suitable processor or collection of processors, whether provided in a single computer or distributed among multiple computers.

Further, it should be appreciated that a computer may be embodied in any of a number of forms, such as a rack-mounted computer, a desktop computer, a laptop computer, or a tablet computer. Additionally, a computer may be embedded in a device not generally regarded as a computer but with suitable processing capabilities, including a Personal Digital Assistant (PDA), a smart phone or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible format.

Such computers may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

The various methods or processes (e.g., of designing and making the SNAPs disclosed above) outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, various inventive concepts may be embodied as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other non-transitory medium or tangible computer storage medium) encoded with one or more programs that, when executed on one or more computers or other processors, perform methods that implement the various embodiments of the invention discussed above. The computer readable medium or media can be transportable, such that the program or programs stored thereon can be loaded onto one or more different computers or other processors to implement various aspects of the present invention as discussed above.

The terms "program" or "software" are used herein in a generic sense to refer to any type of computer code or set of computer-executable instructions that can be employed to program a computer or other processor to implement various aspects of embodiments as discussed above. Additionally, it should be appreciated that according to one aspect, one or more computer programs that when executed perform methods of the present invention need not reside on a single computer or processor, but may be distributed in a modular fashion amongst a number of different computers or processors to implement various aspects of the present invention.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of" "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A superconducting nanowire photodetector comprising:
   a substrate;
   a first nanowire disposed on the substrate and having a first straight section extending along a first direction and a first bent section electrically coupled to the first straight section; and
   a second nanowire disposed on the substrate and having a second straight section parallel to the first straight section and a second bent section electrically coupled to the second straight section and staggered in the first direction with respect to the first bent section,
   wherein the second bent section is staggered with respect to the first bent section by an offset selected to set a peak current density in the second bent section to within about 20% of an average current density in the second straight section.

2. The superconducting nanowire photodetector of claim 1, wherein the first straight section has a width of about 10 nm to about 300 nm.

3. The superconducting nanowire photodetector of claim 1, wherein the first straight section and the second straight section are arrayed on a pitch of about 50 nm to about 500 nm.

4. The superconducting nanowire photodetector of claim 1, wherein the first bent section comprises a boundary defining at least a portion of one of a circle, a parabola, or a hyperbola.

5. The superconducting nanowire photodetector of claim 1, wherein the offset between the second bent section and the first bent section is further selected to set the peak current density in the second bent section to within about 10% of the average current density in the second straight section.

6. The superconducting nanowire photodetector of claim 1, wherein the offset between the second bent section and the first bent section is further selected to set the peak current density in the second bent section to less than or equal to about 110% of a peak current in the first straight section.

7. The superconducting nanowire photodetector of claim 1, wherein the superconducting nanowire photodetector has an avalanche current of about 10 µA.

8. The superconducting nanowire photodetector of claim 7, wherein the superconducting nanowire photodetector is configured to be biased at about 10 µA to about 100 µA above the avalanche current.

9. The superconducting nanowire photodetector of claim 1, further comprising:
a third nanowire disposed on the substrate and having a third straight section parallel to the first straight section and a third bent section electrically coupled to the third straight section, the third bent section staggered in the first direction with respect to at least one of the first bent section or the second bent section.

10. The superconducting nanowire photodetector of claim 1, wherein the first nanowire and the second nanowire are disposed on a first side of the substrate.

11. A method of detecting photons with a superconducting nanowire detector comprising a substrate, a first nanowire disposed on the substrate and having a first straight section extending along a first direction and a first bent section electrically coupled to the first straight section, and a second nanowire disposed on the substrate and having a second straight section parallel to the first straight section and a second bent section electrically coupled to the second straight section and staggered in the first direction with respect to the first bent section, the method comprising:
cooling the superconducting nanowire detector below a critical temperature so as to cause the first nanowire and the second nanowire to become superconducting;
applying a bias current to the first nanowire and the second nanowire; and
measuring a change in resistance of the first nanowire caused by generation of a photoelectron in response to absorption of a photon by the first nanowire,
wherein applying the bias current comprises generating a peak current density in the second bent section that is within about 20% of an average current density in the second straight section.

12. The method of claim 11, wherein the peak current density in the second bent section is within about 10% of an average current density in the second straight section.

13. The method of claim 11, wherein applying the bias current comprises running a current of over about 10 µA through the first nanowire.

14. The method of claim 11, wherein applying the bias current comprises running a current about 10 µA to about 100 µA above the avalanche current through the first nanowire.

15. The method of claim 11, wherein measuring the change in resistance comprises measuring a change of about 100 kΩ to about 10 MΩ.

16. A superconducting nanowire photodetector comprising:
a planar substrate;
conductive material, disposed on the planar substrate, to carry a bias current and an avalanche current generated in response to detection of a photon; and
a plurality of insulating areas formed in the conductive material, the plurality of insulating areas comprising:
a first insulating area defining a first straight edge of the conductive material, the first insulating area having a first curved end tangent to a first line perpendicular to the first straight edge; and
a second insulating area defining a second straight edge of the conductive material parallel to the first straight edge, the second insulating area having a second curved end tangent to a second line parallel to the first line and perpendicular to the first straight edge and the second straight edge,
wherein the first line and the second line are separated by a distance selected to set a peak current density in the conductive material bordering the second curved end to within about 20% of an average current density in the conductive material bordering the second straight edge.

17. The superconducting nanowire photodetector of claim 16, wherein the first curved end has a first shape and the second curved end has a second shape different than the first shape.

18. The superconducting nanowire photodetector of claim 16, wherein a ratio of peak current density of the conductive material bordering the first curved end to an average current density of the conductive material bordering the first straight section is about 1.0 to about 1.2.

19. The superconducting nanowire photodetector of claim 16, wherein the plurality of insulating areas further comprises:
a third insulating area defining a third straight edge of the conductive material parallel to the first straight edge and the second straight edge, the third insulating area having a third curved end tangent to a third line parallel to the first line and the second line and perpendicular to the first straight edge, the second straight edge, and the third straight edge.

20. The superconducting nanowire photodetector of claim 16, wherein the plurality of insulating areas is formed on a first side of the substrate.

* * * * *